United States Statutory Invention Registration [19]

[11] Reg. Number: H877

Antesberger [43] Published: Jan. 1, 1991

[54] LIVE FIRE THERMAL MONITORING SYSTEM

[76] Inventor: Edward A. Antesberger, 4008 Old Hickory Rd., Fairfax, Va. 22032

[21] Appl. No.: 285,268

[22] Filed: Dec. 16, 1988

[51] Int. Cl.[5] ..... H01L 31/00; H04N 5/33

[52] U.S. Cl. ..... 250/330; 250/332; 358/113

[58] Field of Search ..... 250/330, 334, 332; D10/104; 358/906, 113, 301; 434/16

[56] References Cited

U.S. PATENT DOCUMENTS 4,407,009 9/1983 Adamson, Jr. et al. ..... 250/330
4,619,615 10/1986 Kratzenberg ..... 434/16

FOREIGN PATENT DOCUMENTS 3023516 1/1982 Fed. Rep. of Germany ..... 434/16

OTHER PUBLICATIONS

"Videotests", Video Magazine, Jun. 1988, pp. 44–45.

*Primary Examiner*—Thomas H. Tarcza
*Assistant Examiner*—Linda J. Wallace

[57] ABSTRACT

An infrared thermal monitoring system for use by a range or safety officer to monitor and record a tank gunnery training battle scene during poor visibility conditions, such as inclement weather and totally dark night time conditions. The system is comprised of readily available components which are used with the head assembly of a U.S. Army tank thermal sight (TTS) which converts an infrared image of battle scene into a visible image for display. The components are a charge coupled device (CCD) camera mounted on the head assembly for direct viewing of the visible image, a control console which controls the function of the head assembly and provides additional information to the output of the camera.

4 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

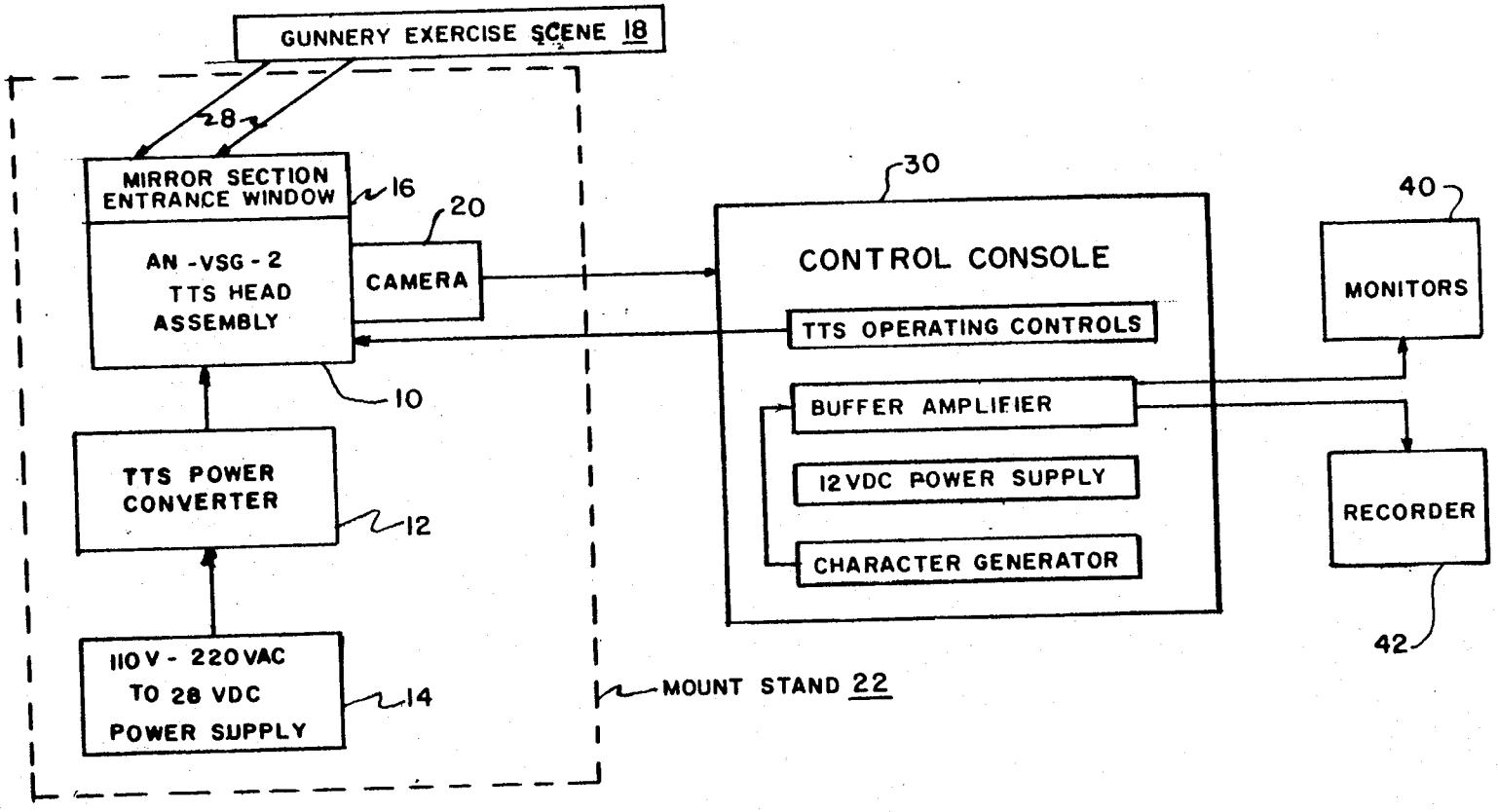
MONITORS
40
RECORDER
42
CONTROL CONSOLE
30
TTS OPERATING CONTROLS
BUFFER AMPLIFIER
12 VDC POWER SUPPLY
CHARACTER GENERATOR
MOUNT STAND 22
GUNNERY EXERCISE SCENE 18
28
MIRROR SECTION ENTRANCE WINDOW
16
CAMERA
20
AN-VSG-2 TTS HEAD ASSEMBLY
10
TTS POWER CONVERTER
12
110V - 220VAC TO 28 VDC POWER SUPPLY
14

LIVE FIRE THERMAL MONITORING SYSTEM

The invention described herein may be manufactured, used, and licensed by the U.S. Government for governmental purposes without the payment of any royalties thereon.

BACKGROUND OF THE INVENTION

1. Field

This invention is in the field of recording the overall scene or selective portions thereof in armored gunnery training exercises in which the recorded battle scenes may be played back and used in the training of tank operations troops.

2. Prior Art

The gunner in a U.S. Army battle tank is equipped with an infrared (IR) gun sight for night firing operations. In a training exercise tank battle scene during periods of bad weather or total darkness the gunner can still see the battle scene. However, under these same conditions the range officer and safety office who need to monitor the entire battle scene do not have the capability to monitor the overall situation and cannot see what actually is happening in the training exercise. These bad weather and total darkness conditions usually call for discontinuing the training exercises to avoid serious accidents with possible fatalities. In the past there has been no satisfactory inclement weather or night time system to record those exercises and thus to discuss errors with gunners, tank drivers, tank commanders or new students after the gunnery exercises are completed.

Some systems have used vidicon cameras looking into the eyepiece of image intensifiers but the system had limited night time capability and no total darkness capability. Time and date reference information have been available but only with cumbersome electronic equipment. Some of this equipment was delicate in operations; especially where cloud cover was immediately followed by bright sunshine. Often high voltage and large power consumption was needed to operate these systems.

The present monitoring and recording system provides a simple, inexpensive yet workable novel system for recording gunnery training exercises, along with providing additional data on the recorded medium, under inclement weather, dusty or night time conditions.

SUMMARY OF THE INVENTION

The present IR thermal monitoring system can watch all maneuvers during tank gunnery training and can record operations at multiple locations of the total battle scene wherein additional information data may be added such as, driver, gunner, vehicle bumper number, date, and time which can be designated and entered onto the recording tape. The information can show environmental conditions as well as provide visual vehicle IR signatures to familiarize troops with these views as seen through the tank gun sight.

The system is comprised of off the shelf vendor components which are attached to the head assembly of an AN/VSG-2 U.S. Army Tank Thermal Sight (TTS). The TTS converts the infrared image into a visible image.

The available vendor items or components are a charge couple device (CCD) camera mounted on the head assembly for viewing the visible battle scene from the head assembly, a control console which controls the function of the head assembly and provides additional data, the monitors, and outputs to the recorder. The recorder may record audio along with the video of the battle scene. The head assembly has an entrance window facing the scene to be monitored. The assembly and camera attached thereto are mounted on a mount stand which allows for movement of the head assembly in azimuth and elevation as desired for viewing various locations of the battle scene.

The invention will be more clearly understood from the following detailed description with reference to the drawing.

BRIEF DESCRIPTION OF THE DRAWING

The single FIGURE is a block diagram schematic of the novel Live Firing Thermal Monitoring System.

DETAILED DESCRIPTION OF THE PREFERRED EMBODIMENT

The present infrared thermal monitoring system is comprised of the head assembly portion 10 of a U.S. Army AN/VSG-2 Tank Thermal Sight (TTS) which has an entrance window section 16 that faces the armored gunnery exercise battle scene, indicated in block form by 18. The incoming image form 18 is indicated by 8. The head assembly 10 contains a power converter 12 and a power supply or power source of 28 volts DC as required. Assemblies 10 and 12 are readily available in the U.S. Army stock and do not require any physical modifications for use in the present system. The assembly 10 is mounted on a mount stand, represented by dashed line 22. Stand 22 has a manually operable rotating base for swinging assembly 10 in azimuth and a mounting cradle for rotating 10 in elevation. Small elevation movements may also be made by a moveable head mirror behind the entrance window section 16. Large elevation movements are controlled by adjustable trunions on stand 22.

A camera, preferably a charge-coupled device (CCD) camera 20, is mounted to 10 by means of an adapter plate. The adapter plate is mounted using existing threaded mounting holes on assembly 10. Various companies make CCD cameras that can be used. As examples, these cameras may be made by SONY or Pulnix and other vendors. The output leads from camera 20 are attached to a control console 30 by flexible electrical cable. The console 30 also has flexible electrical cable attached to assembly 10. Both sets of electrical cables move freely when assembly 10 is moved in azimuth and elevation.

The internal circuitry of console 30 is preferably taken from the driver's viewer portion of an AN/VSG-2 Tank Thermal Sight. Console 30 contains a character generator with capability of 16 pages of information data which can be entered into the monitors 40 and recorder 42 by way of an internal buffer amplifier. This information data may typically be time, date, gunner, driver, weather conditions, tank bumper numbers etc. The data may be combined with the image from the battle scene and later reviewed by appropriate personnel. The console 30 also contains switches and controls for assembly 10 such as on, off, standby, brightness, contrast, and white or black hot polarity. The internal buffer amplifier provides video drive over long cables to possibly a plurality of monitors 40 and to a power supply for camera 20.

The monitor 40, or plurality of monitors placed at multiple locations, are used to show real time action during live fire armored gunnery training or any scene being observed by assembly 10. Multiple monitors may be used so that various observers can provide input back to the range officer operating the console 30. The monitors and recorder are readily available for U.S. Army use. The monitors may be any available as long as they have the RS-170 format. The recorders may be any recorder compatible with the monitors.

While the embodiment is described with respect to specific structure to illustrate the principles and concepts of the invention, various modifications and additions are possible by those skilled in the art without departing from the spirit and scope of the invention as claimed.

I claim;

1. An infrared thermal monitoring system for monitoring and recording maneuvers during armored gunnery training exercises in a live fire battle scene during inclement weather and low visibility conditions, the system comprising:

a tank thermal sight head assembly having an entrance window for viewing the gunnery exercise battle scene and a power source for processing the incoming infrared image of said scene into a visible image, said head assembly mounted on a mount stand that provides movement in azimuth and elevation for positioning said entrance window selectively toward any portion of said battle scene;

a camera attached to said head assembly for receiving said visible image;

a video monitor means for providing real time view of action at multiple locations covering the overall battle scene or any scene being observed by said head assembly of said battle scene;

a recorder means for recording the visual image of each of said multiple locations of said battle scene as present on said monitor means;

a control console means for controlling overall operation of said thermal monitoring system, said control console means having switches and controls for said head assembly and a power supply for said camera connected by flexible electrical cable to allow movement of said assembly in azimuth and elevation, and buffer amplifier to provide video drive over long cables to said monitor means and said recorder means and character generator means for providing information data to said monitor means and recorder means, in the form of designating time, date, weather conditions, driver, gunner, commander, and vehicle number along with the recorded real time view of battle scenes.

2. A system as set forth in claim 1 wherein said camera is a charge-coupled device camera.

3. A system as set forth in claim 1 wherein said video monitor means is a plurality of monitor stations in which each monitor station observes a portion of battle scene and wherein said recorder means is a plurality of video recorders with each recorder recording the video of the portion of the battle scene observed by one of said monitor stations along with any information data designated by said console means.

4. A system as set forth in claim 1 wherein said recorder means is further comprised of an audio recording means.

* * * * *